US011653220B2

(12) United States Patent
Zhao et al.

(10) Patent No.: US 11,653,220 B2
(45) Date of Patent: May 16, 2023

(54) CLOUD-BASED DEPLOYMENT SERVICE IN LOW-POWER AND LOSSY NETWORK

(71) Applicant: Cisco Technology, Inc., San Jose, CA (US)

(72) Inventors: Li Zhao, Shanghai (CN); Chuanwei Li, Shanghai (CN); Lele Zhang, Shanghai (CN); Huimin She, Shanghai (CN)

(73) Assignee: Cisco Technology, Inc., San Jose, CA (US)

( * ) Notice: Subject to any disclaimer, the term of this patent is extended or adjusted under 35 U.S.C. 154(b) by 1008 days.

(21) Appl. No.: 16/375,778

(22) Filed: Apr. 4, 2019

(65) Prior Publication Data
US 2020/0322809 A1    Oct. 8, 2020

(51) Int. Cl.
| H04W 16/18 | (2009.01) |
| H04W 4/02 | (2018.01) |
| G06F 30/20 | (2020.01) |
| H04W 84/18 | (2009.01) |

(52) U.S. Cl.
CPC ............ *H04W 16/18* (2013.01); *G06F 30/20* (2020.01); *H04W 4/025* (2013.01); *H04W 84/18* (2013.01)

(58) Field of Classification Search
CPC ..... H04W 16/18; H04W 24/02; H04W 72/06; H04W 48/20; H04W 4/029; H04W 52/241; H04W 52/242; H04W 52/245; H04W 52/283; H04W 72/085; H04W 72/10; H04W 84/18
See application file for complete search history.

(56) References Cited

U.S. PATENT DOCUMENTS

| 8,923,882 | B2 | 12/2014 | Gandhi et al. | |
| 9,538,331 | B2 | 1/2017 | Ross et al. | |
| 9,730,078 | B2 | 8/2017 | Nixon et al. | |
| 9,973,939 | B2 | 5/2018 | Ross | |
| 2014/0355420 | A1* | 12/2014 | Tran | H04W 24/02 370/235 |
| 2014/0355476 | A1* | 12/2014 | Anderson | H04W 24/02 370/254 |
| 2015/0009857 | A1* | 1/2015 | Rath | H04L 41/5035 370/254 |
| 2017/0332319 | A1* | 11/2017 | Fujimura | H04W 52/0203 |
| 2019/0223029 | A1* | 7/2019 | Clarke | H04W 16/02 |

OTHER PUBLICATIONS

Robinson, Joshua, et al., "A Performance Study of Deployment Factors in Wireless Mesh Networks," May 29, 2007, pp. 2054-2062.

\* cited by examiner

*Primary Examiner* — Kwasi Karikari
(74) *Attorney, Agent, or Firm* — Polsinelli

(57) ABSTRACT

Systems, methods, and computer-readable media for identifying a deployment scheme for forming a wireless mesh network based on environmental characteristics and an optimum deployment scheme. In some examples, a geographical area for deployment of a wireless mesh network is identified. Additionally, environmental information of the geographical area can be collected. Network characteristics of an optimum deployment scheme for forming the wireless mesh network can be defined. As follows, a deployment scheme for forming the wireless mesh network can be identified based on the network characteristics of the optimum deployment scheme and the environmental information of the geographical area.

19 Claims, 12 Drawing Sheets

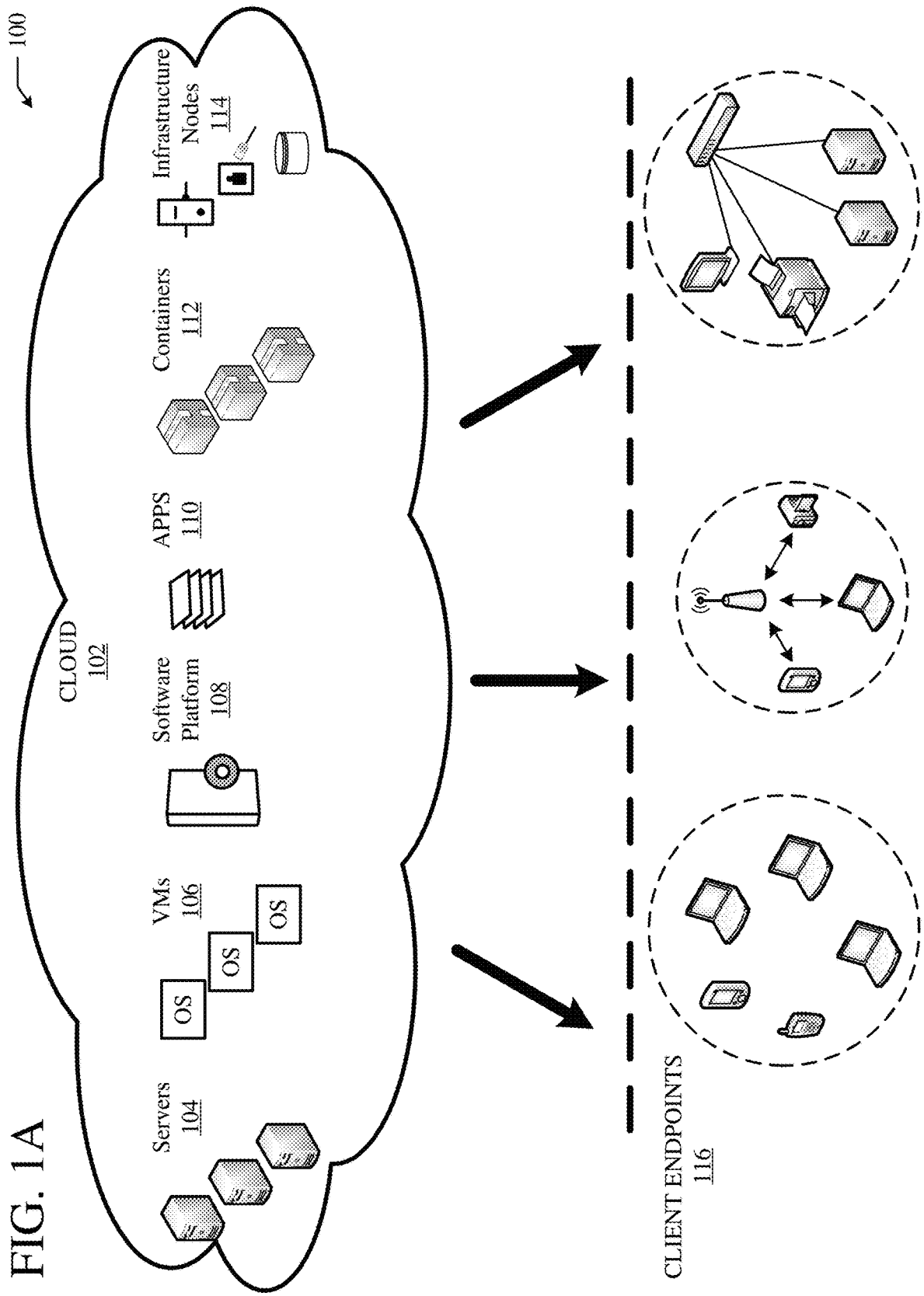

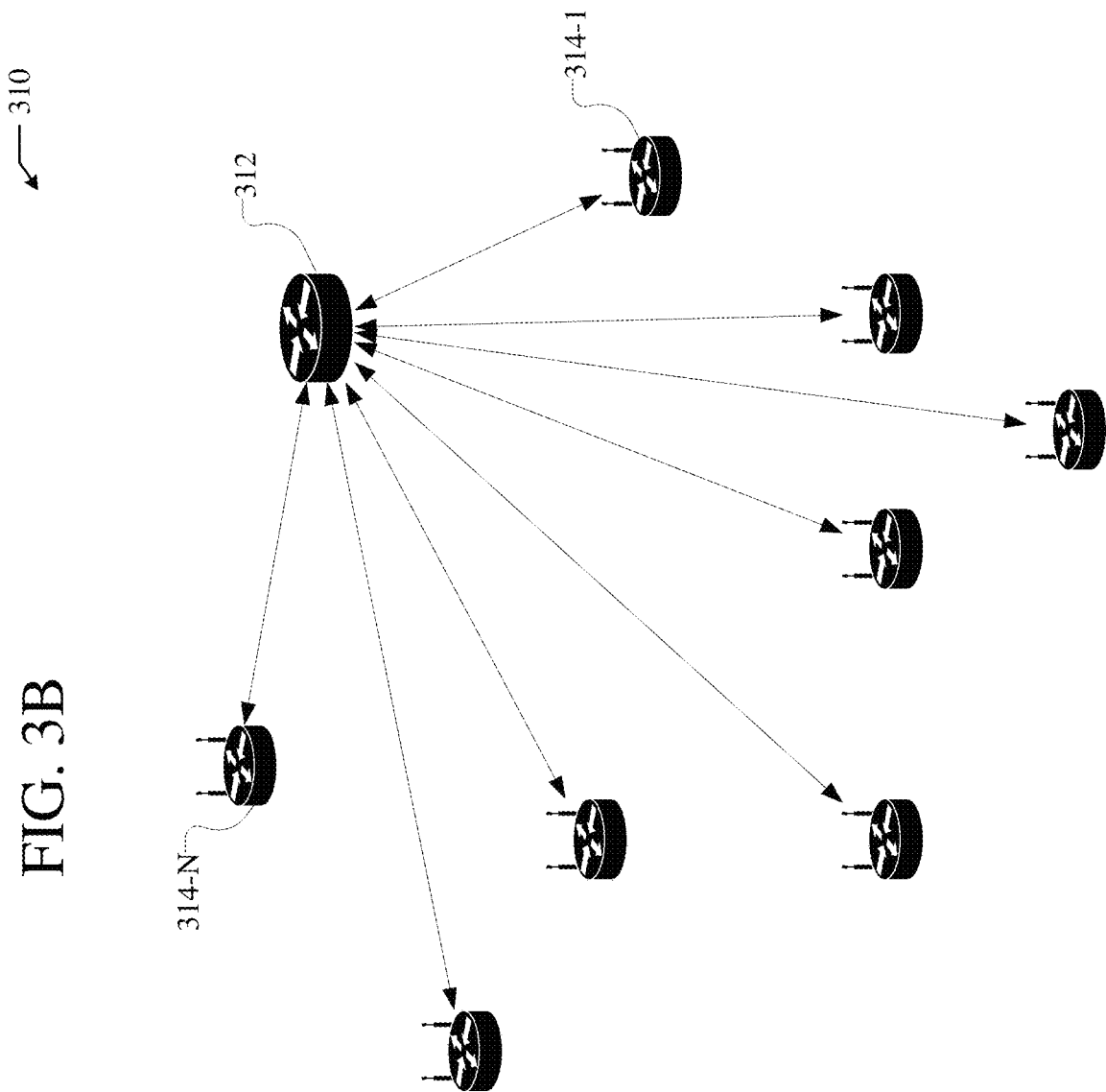

CLOUD-BASED DEPLOYMENT SERVICE IN LOW-POWER AND LOSSY NETWORK

TECHNICAL FIELD

The present technology pertains to identifying a deployment scheme for a wireless mesh network, and in particular to identifying a deployment scheme for a wireless mesh network based on environmental information of a geographical area and network characteristics of an optimum deployment scheme of the wireless mesh network.

BACKGROUND

Currently connected grid mesh (CG-Mesh) networks are being developed for Internet of Things devices and applications. For example, smart grids in Advanced Metering Infrastructure (AMI) networks and distribution automation (DA) gateways in networks have been developed. Additionally, Wireless Smart Utility Networks (Wi-SUN) alliance network standards have been developed for integration in current wireless networks. Wi-SUN compliant networks can promote interoperable wireless standards-based solutions for Internet of Things (IOT) devices.

Often times it is difficult to deploy a wireless mesh network, e.g. CG-mesh network, that has optimized characteristics, e.g. is the lowest cost deployment, for a specific environment. In particular, as the Wi-SUN alliance does not currently cover field deployments, it is difficult to deploy a wireless mesh network that is optimized for a specific environment. Additionally, as runtime environments and optimized characteristics vary by customer, it is difficult to deploy a wireless mesh network that is optimized for a specific environment and a specific customer. There therefore exist needs for systems and methods for developing a wireless mesh network deployment scheme that is optimized for a specific environment and a specific customer.

Further, wireless mesh network deployments can experience a number of field deployment issues that reduce performance characteristics of the wireless mesh network or fail to actually create the wireless mesh network. Specifically, nodes in a wireless mesh network deployment scheme can fail due to channel interference around the nodes created as a result of the deployment scheme. Additionally, nodes can be connected to a network according to a wireless mesh network deployment but actually form a Star network configuration instead of a mesh network configuration. This can degrade network performance characteristics, e.g. increase network latency and throughput requirements. Further, a wireless mesh network deployment scheme can actually form a wireless mesh network, however the scheme can form the mesh network in an inefficient manner, e.g. by utilizing more nodes than is actually required to form the mesh network. There therefore exist needs for systems and methods for developing a wireless mesh network deployment scheme that forms a wireless mesh network optimized for a specific environment and a specific customer.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which:

FIG. 1A illustrates an example cloud computing architecture;

FIG. 3B shows another example wireless network deployment 310 for improperly forming a wireless mesh network;

DESCRIPTION OF EXAMPLE EMBODIMENTS

Figure 1B:
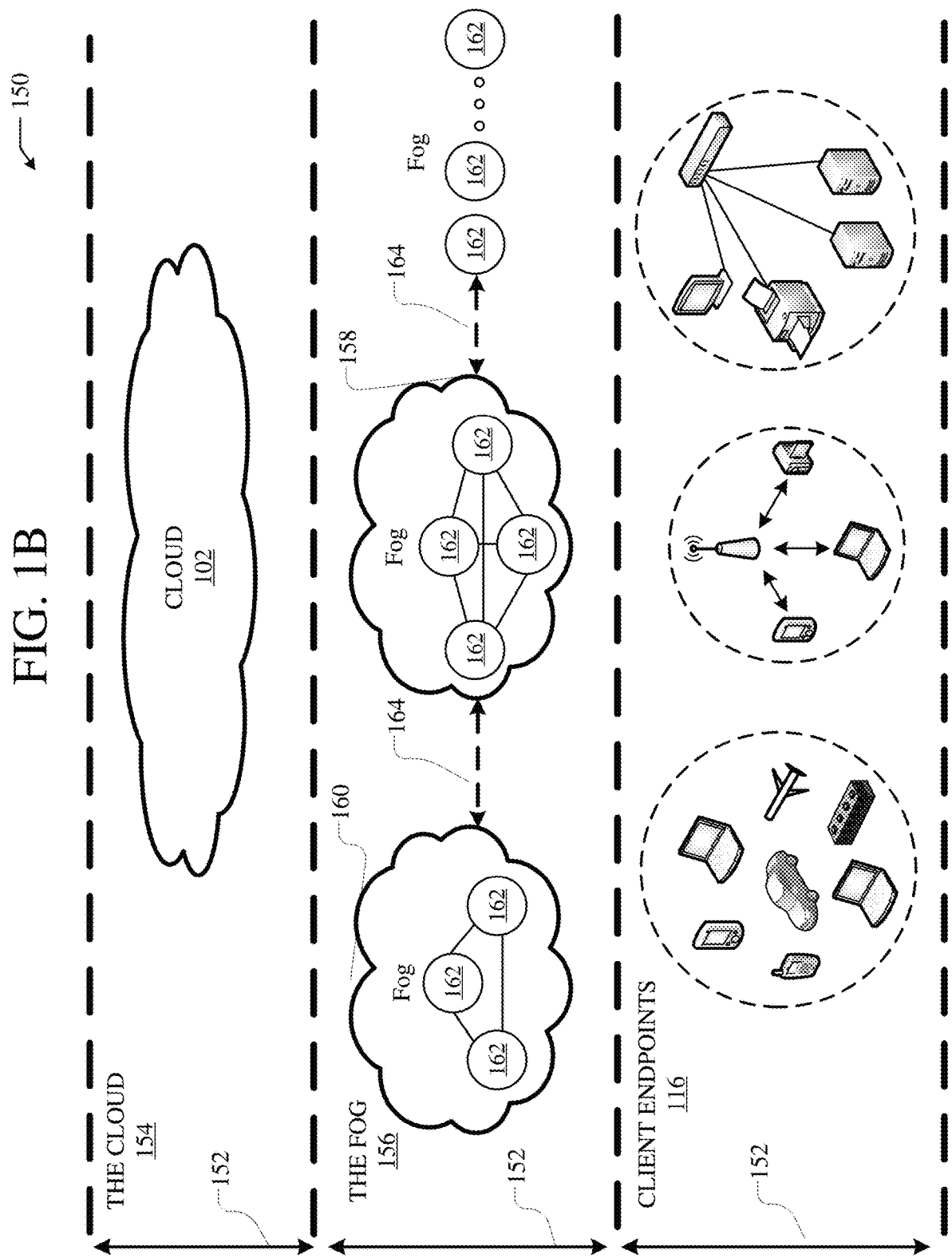
FIG. 1B illustrates an example fog computing architecture.

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure. Thus, the following description and drawings are illustrative and are not to be construed as limiting. Numerous specific details are described to provide a thorough understanding of the disclosure. However, in certain instances, well-known or conventional details are not described in order to avoid obscuring the description. References to one or an embodiment in the present disclosure can be references to the same embodiment or any embodiment; and, such references mean at least one of the embodiments.

Reference to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others.

The terms used in this specification generally have their ordinary meanings in the art, within the context of the disclosure, and in the specific context where each term is used. Alternative language and synonyms may be used for any one or more of the terms discussed herein, and no special significance should be placed upon whether or not a term is elaborated or discussed herein. In some cases, synonyms for certain terms are provided. A recital of one or more synonyms does not exclude the use of other synonyms. The use of examples anywhere in this specification including examples of any terms discussed herein is illustrative only, and is not intended to further limit the scope and meaning of the disclosure or of any example term. Likewise, the disclosure is not limited to various embodiments given in this specification.

Without intent to limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, technical and scientific terms used herein have the meaning as commonly understood by one of ordinary skill in the art to which this disclosure pertains. In the case of conflict, the present document, including definitions will control.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

Overview

A method can include identifying a geographical area for deployment of a wireless mesh network. The method can also include collecting environmental information of the geographical area. Further, the method can include defining network characteristics of an optimum deployment scheme for forming the wireless mesh network. Additionally, a deployment scheme for forming the wireless mesh network can be identified based on the network characteristics of the optimum deployment scheme and the environmental information of the geographical area.

A system can include one or more processors and at least one computer-readable storage medium storing instructions which, when executed by the one or more processors, cause the one or more processors to identify a geographical area for deployment of a Wi-SUN compliant wireless mesh network. The instructions can also cause the one or more processors to collect environmental information of the geographical area. Further, the instructions can cause the one or more processors to define network characteristics of an optimum deployment scheme for forming the wireless mesh network. Additionally, the instructions can cause the one or more processors to identify a deployment scheme for forming the wireless mesh network based on the network characteristics of the optimum deployment scheme and the environmental information of the geographical area.

A non-transitory computer-readable storage medium having stored therein instructions which, when executed by a processor, cause the processor to identify a geographical area for deployment of a wireless mesh network. The instructions can cause the processor to collect environmental information of the geographical area. Further, the instructions can cause the processor to define network characteristics of an optimum deployment scheme for forming the wireless mesh network. The instructions can also cause the processor to identify deployment network characteristics of a deployment scheme for forming the wireless mesh network based on the network characteristics of the optimum deployment scheme and the environmental information of the geographical area.

Example Embodiments

The disclosed technology addresses the need in the art for identifying deployment schemes for forming wireless mesh networks and in particular to identifying a deployment scheme for a wireless mesh network based on environmental information of a geographical area and network characteristics of an optimum deployment scheme of the wireless mesh network. The present technology involves system, methods, and computer-readable media for identifying deployment schemes for forming wireless mesh networks based on environmental information of a geographical area of the wireless mesh network and network characteristics of an optimum deployment scheme for the wireless mesh network.

Figure 7:
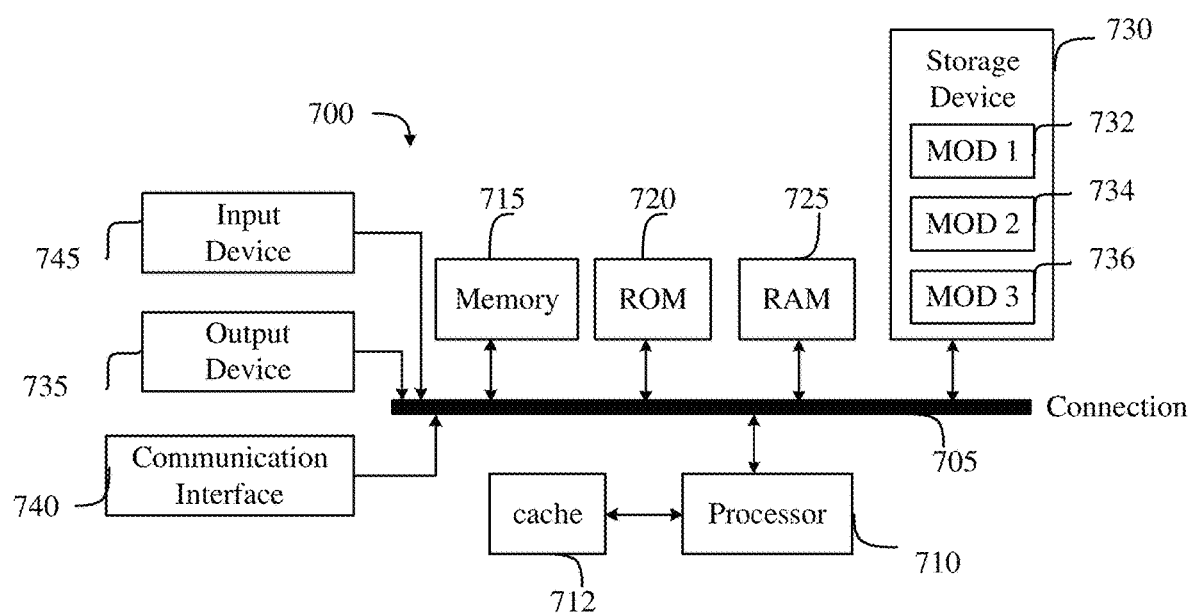
FIG. 7 illustrates an example computing system.
Figure 8:
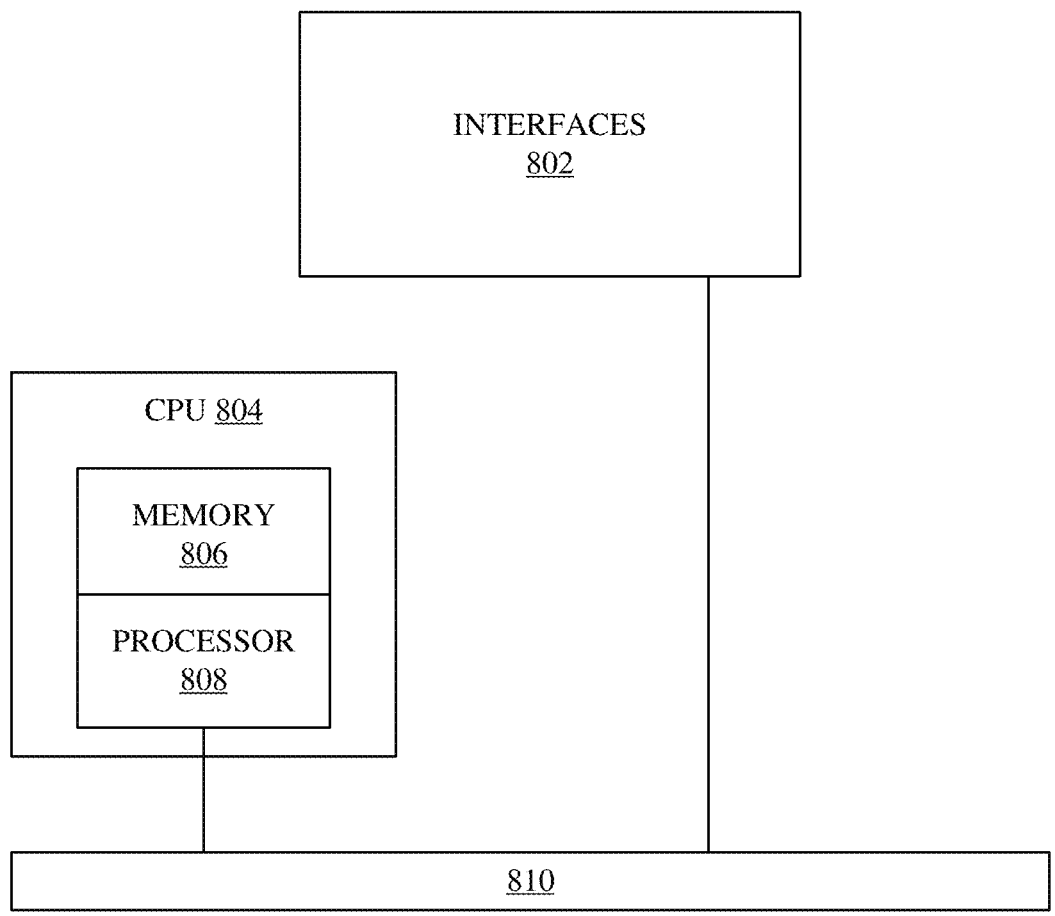
FIG. 8 illustrates an example network device.

A description of network environments and architectures for network data access and services, as illustrated in FIGS. 1A, 1B, 2A, 2B is first disclosed herein. A discussion of systems, methods, and computer-readable medium for identifying wireless deployment schemes based on environmental information of a geographical area and characteristics of an optimum deployment scheme, as shown in FIGS. 3-6, will then follow. The discussion then concludes with a brief description of example devices, as illustrated in FIGS. 7 and 8. These variations shall be described herein as the various embodiments are set forth. The disclosure now turns to FIG. 1A.

FIG. 1A illustrates a diagram of an example cloud computing architecture 100. The architecture can include a cloud 102. The cloud 102 can include one or more private clouds, public clouds, and/or hybrid clouds. Moreover, the cloud 102 can include cloud elements 104-114. The cloud elements 104-114 can include, for example, servers 104, virtual machines (VMs) 106, one or more software platforms 108, applications or services 110, software containers 112, and infrastructure nodes 114. The infrastructure nodes 114 can include various types of nodes, such as compute nodes, storage nodes, network nodes, management systems, etc.

The cloud 102 can provide various cloud computing services via the cloud elements 104-114, such as software as a service (SaaS) (e.g., collaboration services, email services, enterprise resource planning services, content services, communication services, etc.), infrastructure as a service (IaaS) (e.g., security services, networking services, systems management services, etc.), platform as a service (PaaS) (e.g., web services, streaming services, application development services, etc.), and other types of services such as desktop as a service (DaaS), information technology management as a service (ITaaS), managed software as a service (MSaaS), mobile backend as a service (MBaaS), etc.

The client endpoints 116 can connect with the cloud 102 to obtain one or more specific services from the cloud 102. The client endpoints 116 can communicate with elements 104-114 via one or more public networks (e.g., Internet), private networks, and/or hybrid networks (e.g., virtual private network). The client endpoints 116 can include any device with networking capabilities, such as a laptop computer, a tablet computer, a server, a desktop computer, a smartphone, a network device (e.g., an access point, a router, a switch, etc.), a smart television, a smart car, a sensor, a GPS device, a game system, a smart wearable object (e.g., smartwatch, etc.), a consumer object (e.g., Internet refrigerator, smart lighting system, etc.), a city or transportation system (e.g., traffic control, toll collection system, etc.), an internet of things (IoT) device, a camera, a network printer, a transportation system (e.g., airplane, train, motorcycle, boat, etc.), or any smart or connected object (e.g., smart home, smart building, smart retail, smart glasses, etc.), and so forth.

FIG. 1B illustrates a diagram of an example fog computing architecture 150. The fog computing architecture 150 can include the cloud layer 154, which includes the cloud 102 and any other cloud system or environment, and the fog layer 156, which includes fog nodes 162. The client endpoints 116 can communicate with the cloud layer 154 and/or the fog layer 156. The architecture 150 can include one or more communication links 152 between the cloud layer 154, the fog layer 156, and the client endpoints 116. Communications can flow up to the cloud layer 154 and/or down to the client endpoints 116.

The fog layer 156 or "the fog" provides the computation, storage and networking capabilities of traditional cloud networks, but closer to the endpoints. The fog can thus extend the cloud 102 to be closer to the client endpoints 116. The fog nodes 162 can be the physical implementation of fog networks. Moreover, the fog nodes 162 can provide local or regional services and/or connectivity to the client endpoints 116. As a result, traffic and/or data can be offloaded from the cloud 102 to the fog layer 156 (e.g., via fog nodes 162). The fog layer 156 can thus provide faster services and/or connectivity to the client endpoints 116, with lower latency, as well as other advantages such as security benefits from keeping the data inside the local or regional network(s).

The fog nodes 162 can include any networked computing devices, such as servers, switches, routers, controllers, cameras, access points, gateways, etc. Moreover, the fog nodes 162 can be deployed anywhere with a network connection, such as a factory floor, a power pole, alongside a railway track, in a vehicle, on an oil rig, in an airport, on an aircraft, in a shopping center, in a hospital, in a park, in a parking garage, in a library, etc.

In some configurations, one or more fog nodes 162 can be deployed within fog instances 158, 160. The fog instances 158, 158 can be local or regional clouds or networks. For example, the fog instances 156, 158 can be a regional cloud or data center, a local area network, a network of fog nodes 162, etc. In some configurations, one or more fog nodes 162 can be deployed within a network, or as standalone or individual nodes, for example. Moreover, one or more of the fog nodes 162 can be interconnected with each other via links 164 in various topologies, including star, ring, mesh or hierarchical arrangements, for example.

In some cases, one or more fog nodes 162 can be mobile fog nodes. The mobile fog nodes can move to different geographical locations, logical locations or networks, and/or fog instances while maintaining connectivity with the cloud layer 154 and/or the endpoints 116. For example, a particular fog node can be placed in a vehicle, such as an aircraft or train, which can travel from one geographical location and/or logical location to a different geographical location and/or logical location. In this example, the particular fog node may connect to a particular physical and/or logical connection point with the cloud 154 while located at the starting location and switch to a different physical and/or logical connection point with the cloud 154 while located at the destination location. The particular fog node can thus move within particular clouds and/or fog instances and, therefore, serve endpoints from different locations at different times.

Figure 2A:
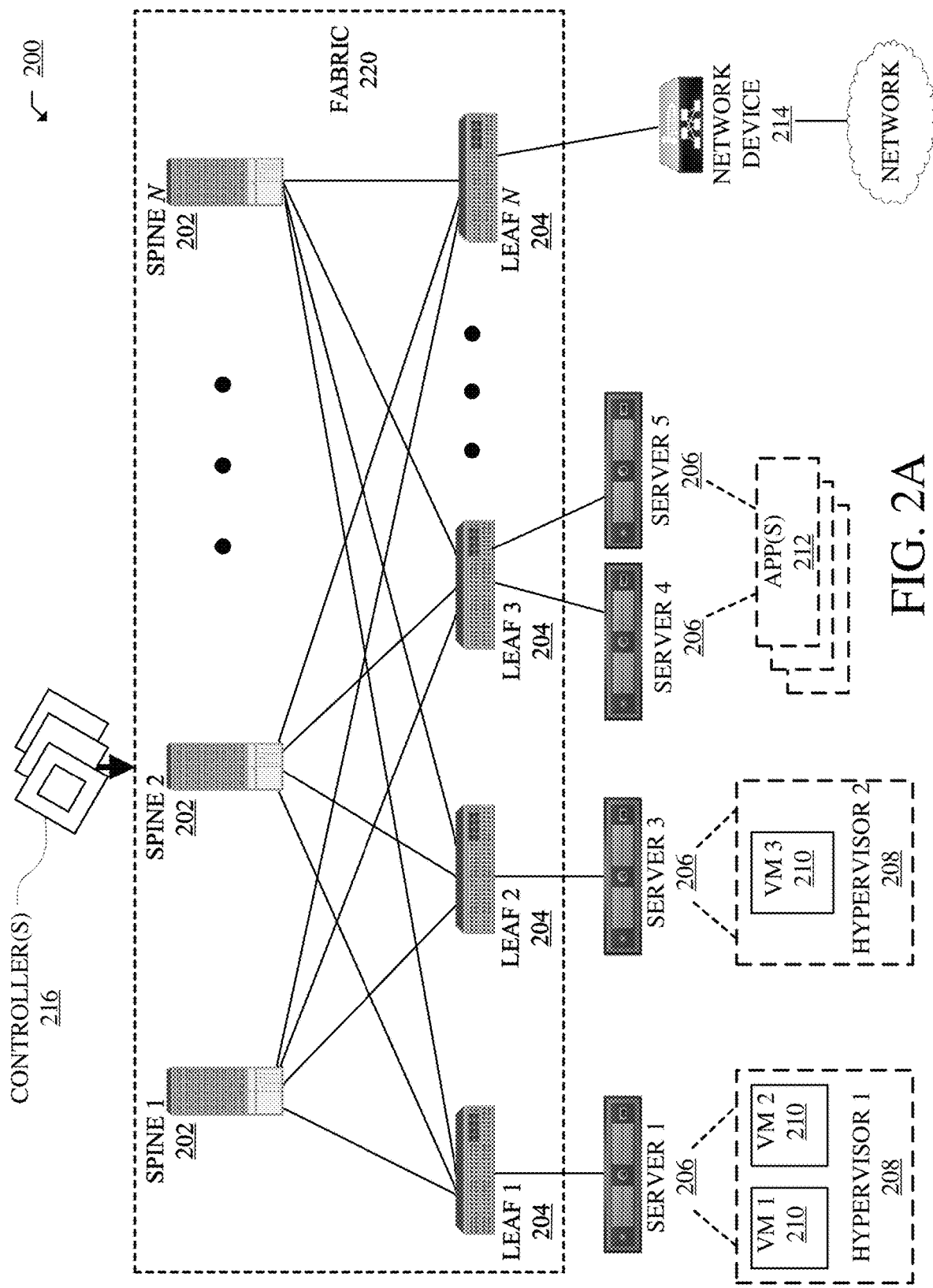
FIG. 2A illustrates a diagram of an example network environment, such as a data center.

FIG. 2A illustrates a diagram of an example Network Environment 200, such as a data center. In some cases, the Network Environment 200 can include a data center, which can support and/or host the cloud 102. The Network Environment 200 can include a Fabric 220 which can represent the physical layer or infrastructure (e.g., underlay) of the Network Environment 200. Fabric 220 can include Spines 202 (e.g., spine routers or switches) and Leafs 204 (e.g., leaf routers or switches) which can be interconnected for routing or switching traffic in the Fabric 220. Spines 202 can interconnect Leafs 204 in the Fabric 220, and Leafs 204 can connect the Fabric 220 to an overlay or logical portion of the Network Environment 200, which can include application services, servers, virtual machines, containers, endpoints, etc. Thus, network connectivity in the Fabric 220 can flow from Spines 202 to Leafs 204, and vice versa. The interconnections between Leafs 204 and Spines 202 can be redundant (e.g., multiple interconnections) to avoid a failure in routing. In some embodiments, Leafs 204 and Spines 202 can be fully connected, such that any given Leaf is connected to each of the Spines 202, and any given Spine is connected to each of the Leafs 204. Leafs 204 can be, for example, top-of-rack ("ToR") switches, aggregation switches, gateways, ingress and/or egress switches, provider edge devices, and/or any other type of routing or switching device.

Leafs 204 can be responsible for routing and/or bridging tenant or customer packets and applying network policies or rules. Network policies and rules can be driven by one or more Controllers 216, and/or implemented or enforced by one or more devices, such as Leafs 204. Leafs 204 can connect other elements to the Fabric 220. For example, Leafs 204 can connect Servers 206, Hypervisors 208, Virtual Machines (VMs) 210, Applications 212, Network Device 214, etc., with Fabric 220. Such elements can reside in one or more logical or virtual layers or networks, such as an overlay network. In some cases, Leafs 204 can encapsulate and decapsulate packets to and from such elements (e.g., Servers 206) in order to enable communications throughout Network Environment 200 and Fabric 220. Leafs 204 can also provide any other devices, services, tenants, or workloads with access to Fabric 220. In some cases, Servers 206 connected to Leafs 204 can similarly encapsulate and decapsulate packets to and from Leafs 204. For example, Servers 206 can include one or more virtual switches or routers or tunnel endpoints for tunneling packets between an overlay or logical layer hosted by, or connected to, Servers 206 and an underlay layer represented by Fabric 220 and accessed via Leafs 204.

Applications 212 can include software applications, services, containers, appliances, functions, service chains, etc. For example, Applications 212 can include a firewall, a database, a CDN server, an IDS/IPS, a deep packet inspection service, a message router, a virtual switch, etc. An application from Applications 212 can be distributed, chained, or hosted by multiple endpoints (e.g., Servers 206, VMs 210, etc.), or may run or execute entirely from a single endpoint.

VMs 210 can be virtual machines hosted by Hypervisors 208 or virtual machine managers running on Servers 206. VMs 210 can include workloads running on a guest operating system on a respective server. Hypervisors 208 can provide a layer of software, firmware, and/or hardware that creates, manages, and/or runs the VMs 210. Hypervisors 208 can allow VMs 210 to share hardware resources on Servers 206, and the hardware resources on Servers 206 to appear as multiple, separate hardware platforms. Moreover, Hypervisors 208 on Servers 206 can host one or more VMs 210.

In some cases, VMs 210 and/or Hypervisors 208 can be migrated to other Servers 206. Servers 206 can similarly be migrated to other locations in Network Environment 200. For example, a server connected to a specific leaf can be changed to connect to a different or additional leaf. Such configuration or deployment changes can involve modifications to settings, configurations and policies that are applied to the resources being migrated as well as other network components.

In some cases, one or more Servers 206, Hypervisors 208, and/or VMs 210 can represent or reside in a tenant or customer space. Tenant space can include workloads, services, applications, devices, networks, and/or resources that are associated with one or more clients or subscribers. Accordingly, traffic in Network Environment 200 can be routed based on specific tenant policies, spaces, agreements, configurations, etc. Moreover, addressing can vary between one or more tenants. In some configurations, tenant spaces can be divided into logical segments and/or networks and separated from logical segments and/or networks associated with other tenants. Addressing, policy, security and configuration information between tenants can be managed by Controllers 216, Servers 206, Leafs 204, etc.

Configurations in Network Environment 200 can be implemented at a logical level, a hardware level (e.g., physical), and/or both. For example, configurations can be implemented at a logical and/or hardware level based on endpoint or resource attributes, such as endpoint types and/or application groups or profiles, through a software-defined network (SDN) framework (e.g., Application-Centric Infrastructure (ACI) or VMWARE NSX). To illustrate, one or more administrators can define configurations at a logical level (e.g., application or software level) through Controllers 216, which can implement or propagate such configurations through Network Environment 200. In some examples, Controllers 216 can be Application Policy Infrastructure Controllers (APICs) in an ACI framework. In other examples, Controllers 216 can be one or more management components for associated with other SDN solutions, such as NSX Managers.

Such configurations can define rules, policies, priorities, protocols, attributes, objects, etc., for routing and/or classifying traffic in Network Environment 200. For example, such configurations can define attributes and objects for classifying and processing traffic based on Endpoint Groups (EPGs), Security Groups (SGs), VM types, bridge domains (BDs), virtual routing and forwarding instances (VRFs), tenants, priorities, firewall rules, etc. Other example network objects and configurations are further described below. Traffic policies and rules can be enforced based on tags, attributes, or other characteristics of the traffic, such as protocols associated with the traffic, EPGs associated with the traffic, SGs associated with the traffic, network address information associated with the traffic, etc. Such policies and rules can be enforced by one or more elements in Network Environment 200, such as Leafs 204, Servers 206, Hypervisors 208, Controllers 216, etc. As previously explained, Network Environment 200 can be configured according to one or more particular software-defined network (SDN) solutions, such as CISCO ACI or VMWARE NSX. These example SDN solutions are briefly described below.

ACI can provide an application-centric or policy-based solution through scalable distributed enforcement. ACI supports integration of physical and virtual environments under a declarative configuration model for networks, servers, services, security, requirements, etc. For example, the ACI framework implements EPGs, which can include a collection of endpoints or applications that share common configuration requirements, such as security, QoS, services, etc. Endpoints can be virtual/logical or physical devices, such as VMs, containers, hosts, or physical servers that are connected to Network Environment 200. Endpoints can have one or more attributes such as a VM name, guest OS name, a security tag, application profile, etc. Application configurations can be applied between EPGs, instead of endpoints directly, in the form of contracts. Leafs 204 can classify incoming traffic into different EPGs. The classification can be based on, for example, a network segment identifier such as a VLAN ID, VXLAN Network Identifier (VNID), NVGRE Virtual Subnet Identifier (VSID), MAC address, IP address, etc.

In some cases, classification in the ACI infrastructure can be implemented by Application Virtual Switches (AVS), which can run on a host, such as a server or switch. For example, an AVS can classify traffic based on specified attributes, and tag packets of different attribute EPGs with different identifiers, such as network segment identifiers (e.g., VLAN ID). Finally, Leafs 204 can tie packets with their attribute EPGs based on their identifiers and enforce policies, which can be implemented and/or managed by one or more Controllers 216. Leaf 204 can classify to which EPG the traffic from a host belongs and enforce policies accordingly.

Another example SDN solution is based on VMWARE NSX. With VMWARE NSX, hosts can run a distributed firewall (DFW) which can classify and process traffic. Consider a case where three types of VMs, namely, application, database and web VMs, are put into a single layer-2 network segment. Traffic protection can be provided within the network segment based on the VM type. For example, HTTP traffic can be allowed among web VMs, and disallowed between a web VM and an application or database VM. To classify traffic and implement policies, VMWARE NSX can implement security groups, which can be used to group the specific VMs (e.g., web VMs, application VMs, database VMs). DFW rules can be configured to implement policies for the specific security groups. To illustrate, in the context of the previous example, DFW rules can be configured to block HTTP traffic between web, application, and database security groups.

Returning now to FIG. 2A, Network Environment 200 can deploy different hosts via Leafs 204, Servers 206, Hypervisors 208, VMs 210, Applications 212, and Controllers 216, such as VMWARE ESXi hosts, WINDOWS HYPER-V hosts, bare metal physical hosts, etc. Network Environment 200 may interoperate with a variety of Hypervisors 208, Servers 206 (e.g., physical and/or virtual servers), SDN orchestration platforms, etc. Network Environment 200 may implement a declarative model to allow its integration with application design and holistic network policy.

Controllers 216 can provide centralized access to fabric information, application configuration, resource configuration, application-level configuration modeling for a software-defined network (SDN) infrastructure, integration with management systems or servers, etc. Controllers 216 can form a control plane that interfaces with an application plane via northbound APIs and a data plane via southbound APIs.

As previously noted, Controllers 216 can define and manage application-level model(s) for configurations in Network Environment 200. In some cases, application or device configurations can also be managed and/or defined by other components in the network. For example, a hypervisor or virtual appliance, such as a VM or container, can run a server or management tool to manage software and services in Network Environment 200, including configurations and settings for virtual appliances.

As illustrated above, Network Environment 200 can include one or more different types of SDN solutions, hosts, etc. For the sake of clarity and explanation purposes, various examples in the disclosure will be described with reference to an ACI framework, and Controllers 216 may be interchangeably referenced as controllers, APICs, or APIC controllers. However, it should be noted that the technologies and concepts herein are not limited to ACI solutions and may be implemented in other architectures and scenarios, including other SDN solutions as well as other types of networks which may not deploy an SDN solution.

Further, as referenced herein, the term "hosts" can refer to Servers 206 (e.g., physical or logical), Hypervisors 208, VMs 210, containers (e.g., Applications 212), etc., and can run or include any type of server or application solution. Non-limiting examples of "hosts" can include virtual switches or routers, such as distributed virtual switches (DVS), application virtual switches (AVS), vector packet processing (VPP) switches; VCENTER and NSX MANAGERS; bare metal physical hosts; HYPER-V hosts; VMs; DOCKER Containers; etc.

Figure 2B:
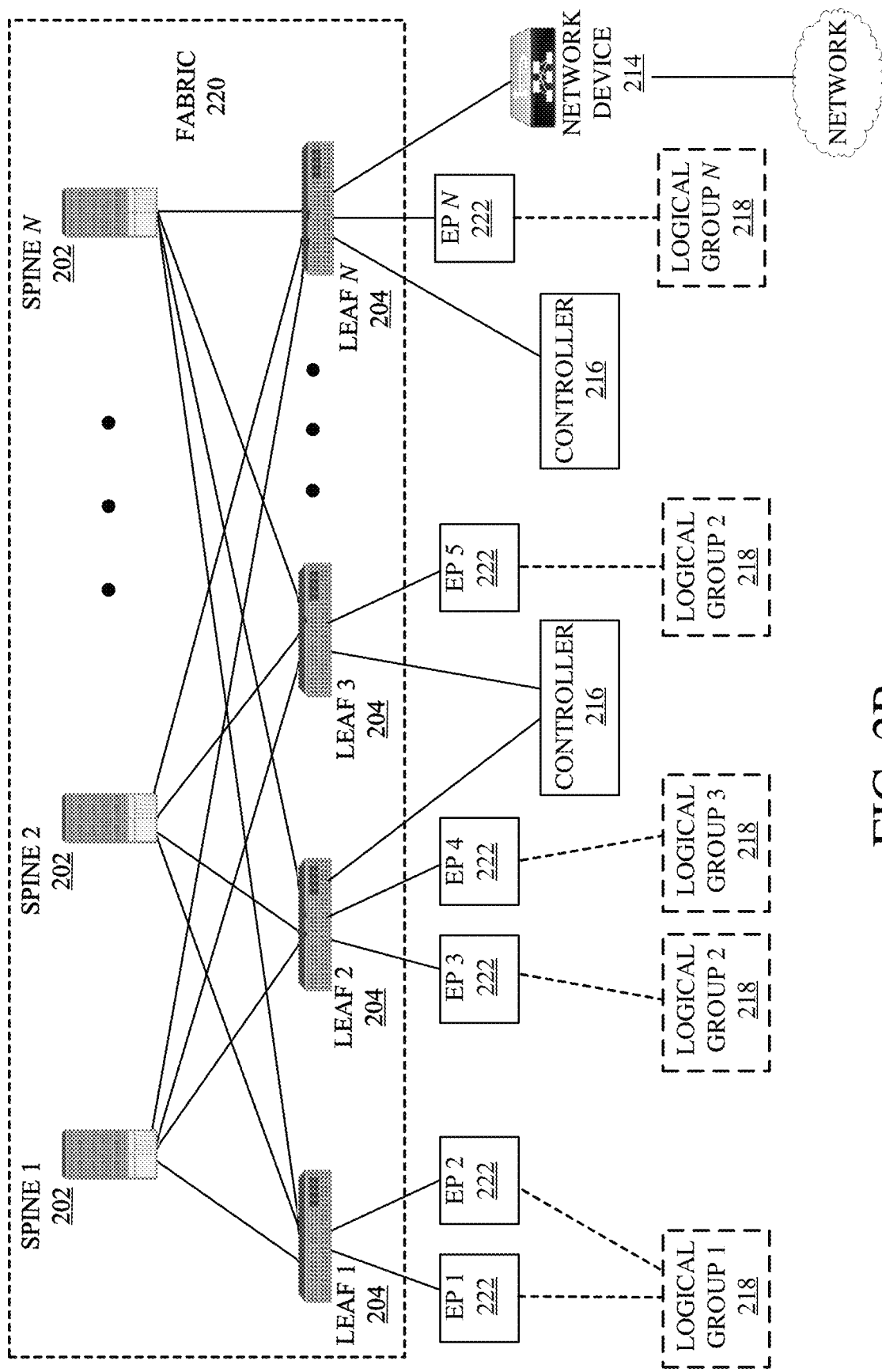
FIG. 2B illustrates another example of a network environment.

FIG. 2B illustrates another example of Network Environment 200. In this example, Network Environment 200 includes Endpoints 222 connected to Leafs 204 in Fabric 220. Endpoints 222 can be physical and/or logical or virtual entities, such as servers, clients, VMs, hypervisors, software containers, applications, resources, network devices, workloads, etc. For example, an Endpoint 222 can be an object that represents a physical device (e.g., server, client, switch, etc.), an application (e.g., web application, database application, etc.), a logical or virtual resource (e.g., a virtual switch, a virtual service appliance, a virtualized network function (VNF), a VM, a service chain, etc.), a container running a software resource (e.g., an application, an appliance, a VNF, a service chain, etc.), storage, a workload or workload engine, etc. Endpoints 122 can have an address (e.g., an identity), a location (e.g., host, network segment, virtual routing and forwarding (VRF) instance, domain, etc.), one or more attributes (e.g., name, type, version, patch level, OS name, OS type, etc.), a tag (e.g., security tag), a profile, etc.

Endpoints 222 can be associated with respective Logical Groups 218. Logical Groups 218 can be logical entities containing endpoints (physical and/or logical or virtual) grouped together according to one or more attributes, such as endpoint type (e.g., VM type, workload type, application type, etc.), one or more requirements (e.g., policy requirements, security requirements, QoS requirements, customer requirements, resource requirements, etc.), a resource name (e.g., VM name, application name, etc.), a profile, platform or operating system (OS) characteristics (e.g., OS type or name including guest and/or host OS, etc.), an associated network or tenant, one or more policies, a tag, etc. For example, a logical group can be an object representing a collection of endpoints grouped together. To illustrate, Logical Group 1 can contain client endpoints, Logical Group 2 can contain web server endpoints, Logical Group 3 can contain application server endpoints, Logical Group N can contain database server endpoints, etc. In some examples, Logical Groups 218 are EPGs in an ACI environment and/or other logical groups (e.g., SGs) in another SDN environment.

Traffic to and/or from Endpoints 222 can be classified, processed, managed, etc., based Logical Groups 218. For example, Logical Groups 218 can be used to classify traffic to or from Endpoints 222, apply policies to traffic to or from Endpoints 222, define relationships between Endpoints 222, define roles of Endpoints 222 (e.g., whether an endpoint consumes or provides a service, etc.), apply rules to traffic to or from Endpoints 222, apply filters or access control lists (ACLs) to traffic to or from Endpoints 222, define communication paths for traffic to or from Endpoints 222, enforce requirements associated with Endpoints 222, implement security and other configurations associated with Endpoints 222, etc.

In an ACI environment, Logical Groups 218 can be EPGs used to define contracts in the ACI. Contracts can include rules specifying what and how communications between EPGs take place. For example, a contract can define what provides a service, what consumes a service, and what policy objects are related to that consumption relationship. A contract can include a policy that defines the communication path and all related elements of a communication or relationship between endpoints or EPGs. For example, a Web EPG can provide a service that a Client EPG consumes, and that consumption can be subject to a filter (ACL) and a service graph that includes one or more services, such as firewall inspection services and server load balancing.

As discussed previously, CG-Mesh networks are being developed for IoT devices and applications. For example, smart grids in AMI networks and distribution automation DA gateways in networks have been developed. Additionally, Wi-SUN alliance network standards have been developed for integration in current wireless networks. Wi-SUN compliant networks can promote interoperable wireless standards-based solutions for IoT devices.

Often times it is difficult to deploy a wireless mesh network, e.g. CG-mesh network, that has optimized characteristics, e.g. is the lowest cost deployment, for a specific environment. In particular, as the Wi-SUN alliance does not currently cover field deployments, it is difficult to deploy a wireless mesh network that is optimized for a specific environment. Additionally, as runtime environments and optimized characteristics vary by customer, it is difficult to deploy a wireless mesh network that is optimized for a specific environment and a specific customer.

Further, wireless mesh network deployments can experience a number of field deployment issues that reduce performance characteristics of the wireless mesh network or fail to actually create the wireless mesh network. Specifically, nodes in a wireless mesh network deployment scheme can fail due to channel interference around the nodes created as a result of the deployment scheme. Additionally, nodes can be connected to a network according to a wireless mesh network deployment but actually form a Star network configuration instead of a mesh network configuration. This can degrade network performance characteristics, e.g. increase network latency and throughput requirements. Further, a wireless mesh network deployment scheme can actually form a wireless mesh network, however the scheme can form the mesh network in an inefficient manner, e.g. by utilizing more nodes than is actually required to form the mesh network. These problems can be come exacerbated when a customer is deploying a large number of nodes to form a wireless mesh network. Often times, customers are forced to send engineers to a deployment location to collect enough environmental information and choose a feasible deployment scheme based on the environmental information. This is very difficult to properly perform when a network involves a large numbers of nodes.

The present includes systems, methods, and computer-readable mediums for identifying a wireless mesh network deployment scheme for a specific environment. A geographical area for deployment of a wireless mesh network is identified. Environmental information of the geographical area is collected. The wireless mesh network can be a Wi-SUN network and the wireless mesh network deployment scheme can be used to deploy the Wi-SUN network into the specific environment. Further, network characteristics of an optimum deployment scheme for forming the wireless mesh network are defined. In turn, a deployment scheme for forming the wireless mesh network can be identified based on the network characteristics of the optimum deployment scheme and the environmental information of the geographical area. Additionally, deployment network characteristics of the identified deployment scheme can be determined based on the network characteristics of the optimum deployment scheme and the environmental information of the geographical area. Subsequently, the deployment network characteristics of the identified deployment scheme can actually be used to deploy the wireless mesh network according to the optimum deployment scheme.

Wireless networks can be improperly deployed in a number of different ways to form or attempt to form a wireless mesh network. Improperly forming a wireless mesh network can include forming a wireless network that is not organized in a mesh topology. Additionally, improperly forming a wireless mesh network can include forming a wireless network with mesh nodes that are unable to transmit and/or receive traffic through the mesh network. Further, improperly forming a wireless mesh network can include forming a wireless network that wastes node resources and hardware resources in forming the wireless mesh network. For example, a wireless mesh network can be improperly formed if uses more nodes than are required to provide wireless coverage over a specific service area.

A wireless mesh network, as used herein, can be formed through an applicable wireless networking protocol for providing network service access wirelessly through a mesh network. For example, a wireless mesh network can be formed through an applicable IEEE 802.11 WiFi compliant protocol. In another example, a wireless mesh network can be formed through a Wi-SUN alliance Field Area Network (FAN) protocol. Further, a wireless mesh network can be formed through an applicable low energy wireless transfer protocol. For example, a wireless mesh network can be formed according to a Bluetooth® or Zigbee® protocol. Further, a wireless mesh network can be implemented to provide network service access using an applicable network environment, such as the network environments 200 shown in FIGS. 2A and 2B.

Figure 3A:
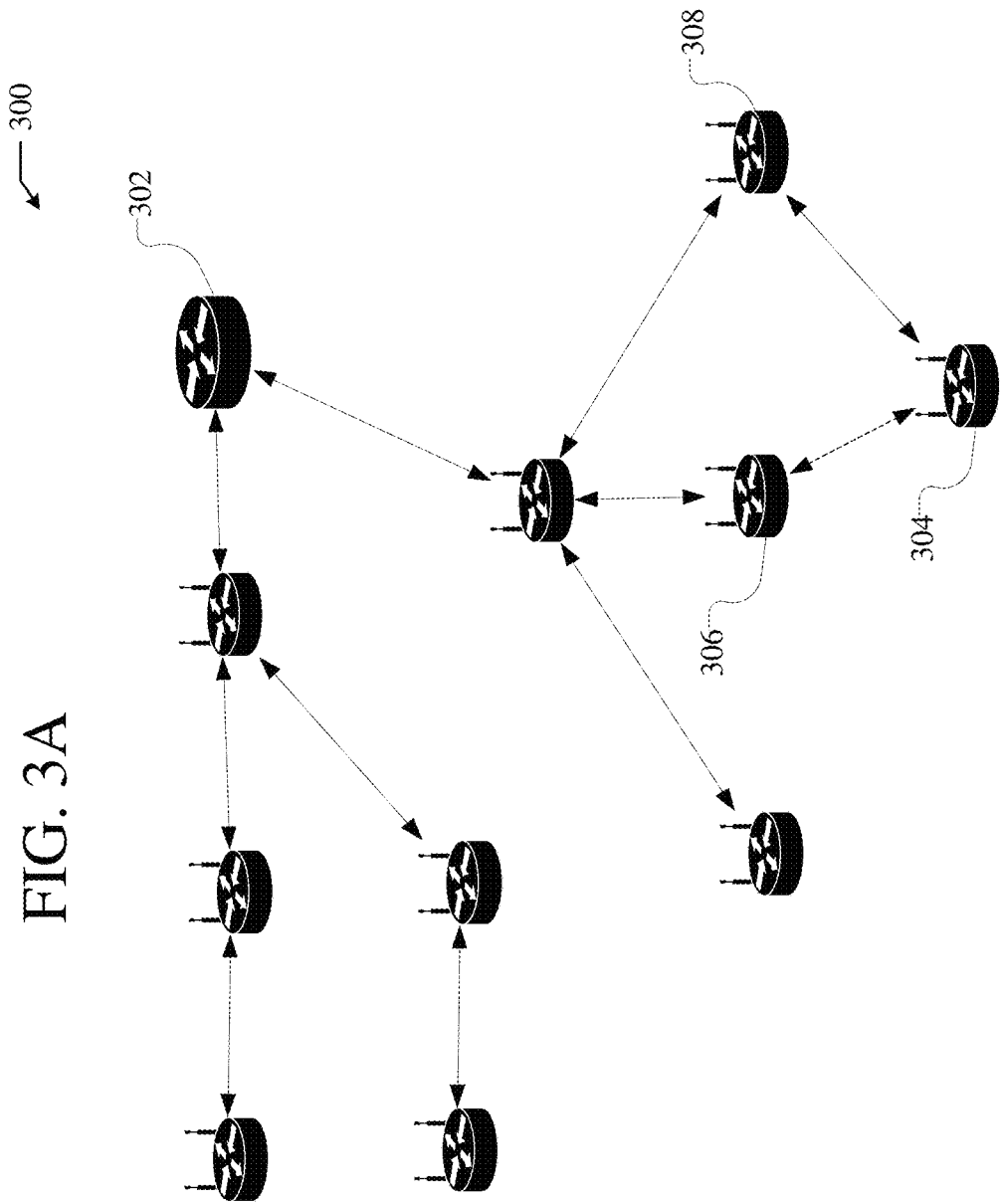
FIG. 3A shows an example wireless network deployment 300 for improperly forming a wireless mesh network.

FIG. 3A shows an example wireless network deployment 300 for improperly forming a wireless mesh network. The deployment 300 includes a root node 302 of a wireless mesh network. A root node of a wireless mesh network, as used herein, includes a node in the wireless mesh network that all or a portion of network traffic passes through in providing network service access. Specifically, a root node of a wireless mesh network can include a node that traffic passes through between a wireless mesh network and a network backhaul to provide network service access. A root node of a wireless mesh network can be implemented through an applicable routing device. Specifically, a root node of a wireless mesh network can be implemented as an applicable routing device of a FAN. For example, a root node of a wireless mesh network can be a Connected Grid Router (CGR).

The deployment 300 also includes a plurality of wireless nodes. Specifically, the deployment 300 includes a first wireless node 304, a second wireless node 306, and a third wireless node 308. Wireless nodes, as used herein, function according to an applicable device for transmitting and/or receiving data wirelessly for providing network service access. For example, a wireless node can include an access point for providing wireless network service access according to an applicable IEEE 802.11 WiFi compliant protocol or a Wi-SUN compliant node. In another example a wireless node can provide wireless network service access according to an applicable low energy wireless transfer protocol, e.g. Bluetooth®. A wireless node can form part of a wireless mesh network for providing one or more clients network service access to a network through the wireless mesh network.

In the example deployment 300 shown in FIG. 3A, the first wireless node 304 is off-line because of channel interference between the first wireless node 304 and the second wireless node 306. This channel interference can be created as a result of the proximity of the first wireless node 304 and the second wireless node 306 between each other. The third wireless node 308 can function as a range extender node to connect the first wireless node 304 to the root node 302 as part of a wireless mesh network. This is an efficient usage of resources in forming the wireless mesh network, as the third wireless node 308 has to dedicated an amount of additional network and computational resources to provide range extending to the first wireless node 304. As follows, the deployment 300 shown in FIG. 3A can be characterized as an improper wireless mesh network deployment.

FIG. 3B shows another example wireless network deployment 310 for improperly forming a wireless mesh network. The example wireless network deployment 310 shown in FIG. 3B includes a root node 312 and a plurality of wireless nodes 314-1 . . . 314-N (wireless nodes 314). The wireless nodes 314 are each coupled to the root node 312. Specifically, each of the wireless nodes 314 is directly coupled to the root node 312, without being connected to the root node 312 through any intervening wireless nodes. This can lead to decreased network performance when compared to a wireless mesh network, e.g. decreased network traffic throughput and latency. Therefore, the wireless nodes 314 form a Star network with the root node 312 and not a mesh network. As follows, the deployment 310 shown in FIG. 3B can be characterized as an improper wireless mesh network deployment.

Figure 3C:
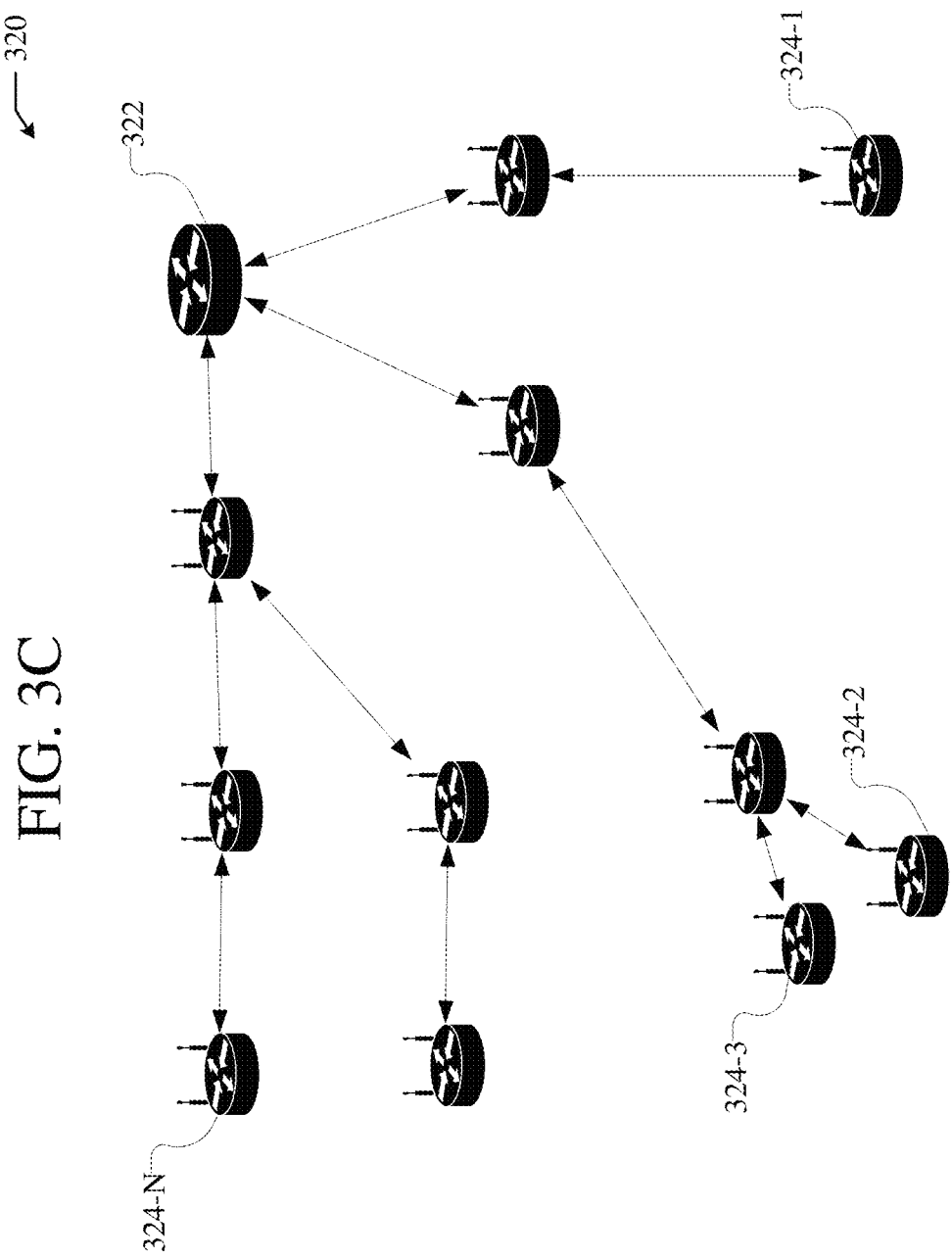
FIG. 3C shows yet another example wireless network deployment 320 for improperly forming a wireless mesh network.

FIG. 3C shows yet another example wireless network deployment 320 for improperly forming a wireless mesh network. The example wireless network deployment 320 shown in FIG. 3C includes a root node 322 and a plurality of wireless nodes 324-1 . . . 324-N (wireless nodes 324). The wireless network deployment uses more wireless nodes than are necessary to provide wireless network service access within a specific area. For example, both a second wireless node 324-2 and a third wireless node 324-3 can overlap in wireless coverage area, thereby resulting in redundant use of resources and unnecessary expenses for customers. As follows, the deployment 320 shown in FIG. 3C can be characterized as an improper wireless mesh network deployment.

Figure 4:
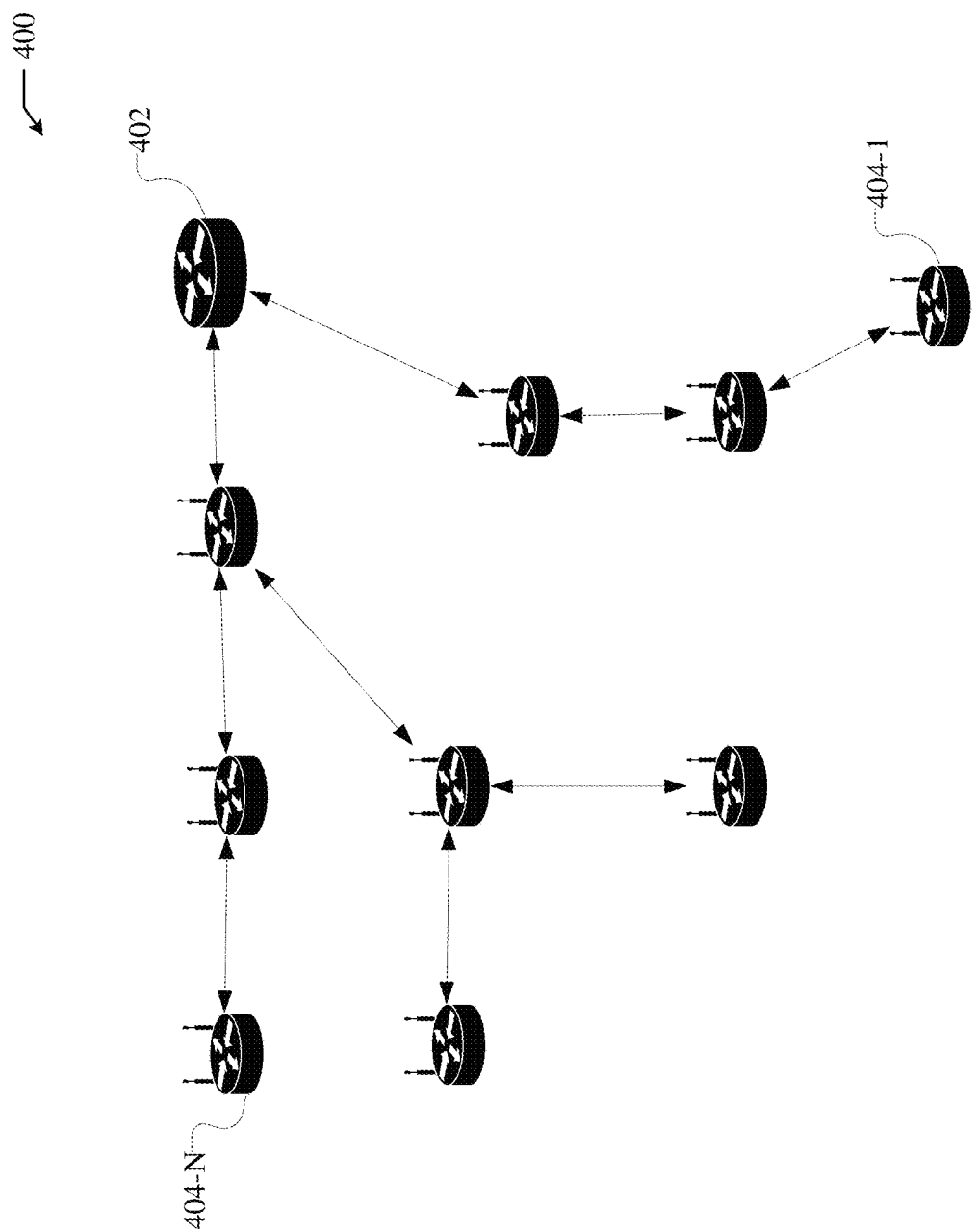
FIG. 4 shows an example wireless network deployment 400 for properly forming a wireless mesh network, e.g. an optimum deployment.

FIG. 4 shows an example wireless network deployment 400 for properly forming a wireless mesh network, e.g. an optimum deployment. The deployment 400 includes a root node 402 and a plurality of wireless nodes 404-1 ... 404-N (wireless nodes 404). As shown in FIG. 4, the deployment 400 forms a mesh network and is therefore a properly formed wireless mesh network, as opposed to the deployment 310 shown in FIG. 3B. Further, as shown in FIG. 4, the deployment 400 includes wireless nodes that are properly spaced to provide wireless access over an area while not interfering with each other, as is the case shown in the deployment 300 in FIG. 3A. Further, the deployment 400 does not include unnecessary wireless nodes, e.g. which significantly overlap in wireless coverage area, such as shown in the deployment 320 in FIG. 3C. Therefore, the deployment 400 can be characterized as a deployment for properly forming a wireless mesh network, e.g. an optimum deployment. As will be discussed in greater detail later, an optimum deployment can be defined according to preferred deployment characteristics of a deployment.

Figure 5:
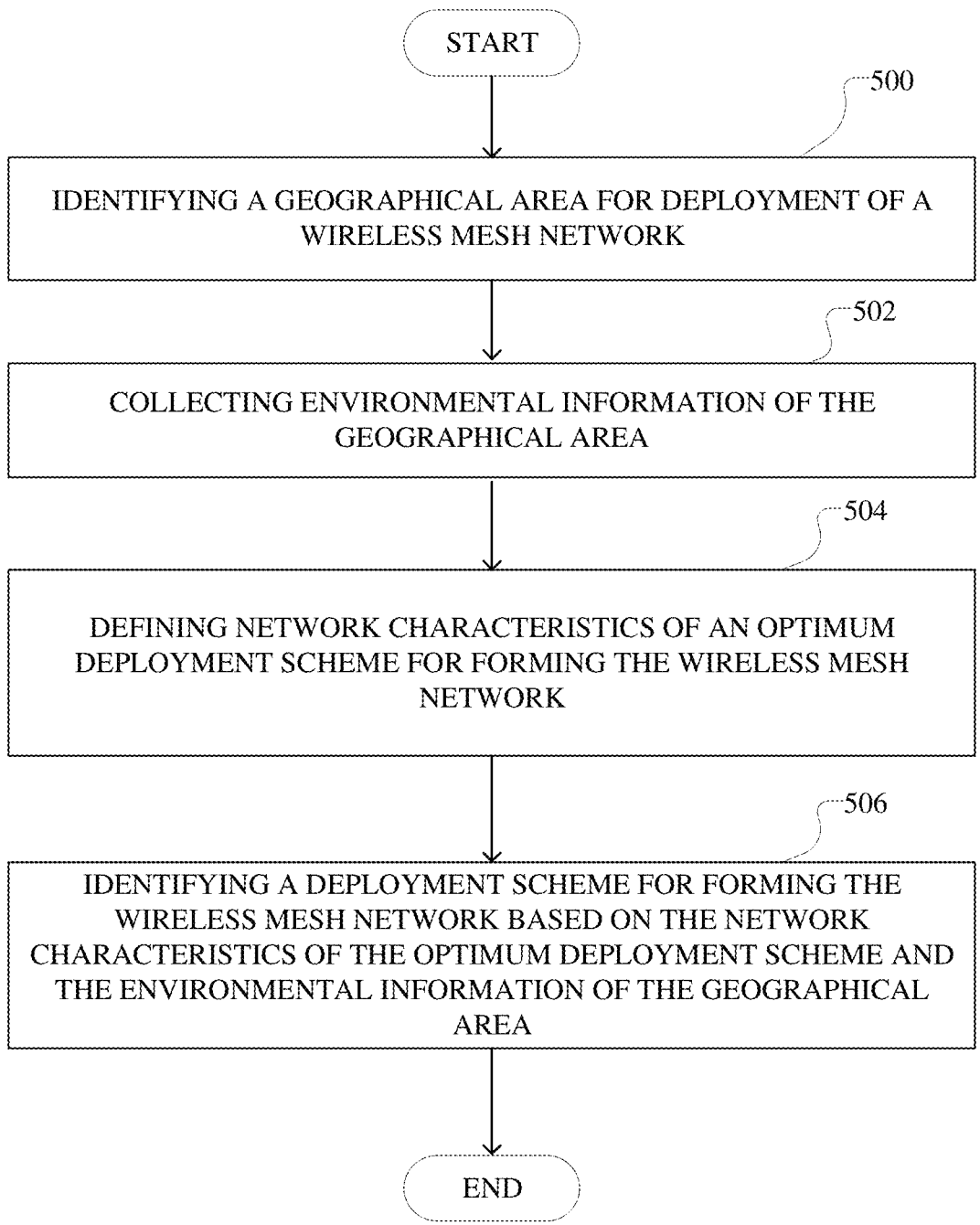
FIG. 5 illustrates a flowchart for an example method of identifying a deployment scheme for forming a wireless mesh network based on a geographical area and an optimum deployment scheme for the wireless mesh network.

FIG. 5 illustrates a flowchart for an example method of identifying a deployment scheme for forming a wireless mesh network based on a geographical area and an optimum deployment scheme for the wireless mesh network. The method shown in FIG. 5 is provided by way of example, as there are a variety of ways to carry out the method. Additionally, while the example method is illustrated with a particular order of steps, those of ordinary skill in the art will appreciate that FIG. 5 and the modules shown therein can be executed in any order and can include fewer or more modules than illustrated. Each module shown in FIG. 5 represents one or more steps, processes, methods or routines in the method.

All or a portion of the example method shown in FIG. 5 can be performed remote from a geographical area for which a network deployment is identified. Specifically, all or portions of the example method shown in FIG. 5 can be performed in an applicable cloud computing or fog computing environment, such as the example cloud computing architecture 100 shown in FIG. 1A and the example fog computing architecture 150 shown in FIG. 1B.

At step 500, a geographical area in which a wireless mesh network will be deployed is identified. The geographical area can include a region at or around a geographical location. For example, a geographical area can include an area defined by five city blocks within a city. The geographical area can be identified based on a customer. For example, a customer can indicate a need to deploy a wireless mesh network to a specific campus of the customer. The geographical area can be identified before field deployment of the wireless mesh network actually occurs. Specifically, the geographical area can be identified before network engineers are actually sent to the geographical area to deploy the wireless mesh network. In various embodiments, the wireless mesh network is a Wi-SUN compliant network.

At step 502, environmental information of the geographical area is collected. Environmental information of a geographical area can include applicable characteristics of the geographical area. Specifically, environmental information of a geographical area can include applicable characteristics of a geographical area for deploying a wireless mesh network into the geographical area. For example, environmental characteristics of a geographical area can include locations of objects within the geographical area, shapes of object within the geographical area, material compositions of objects within the geographical area, temperature(s) in the geographical area, humidity measurement(s) in the geographical area, line of sight information within the geographical area, background noise information within the geographical area, radio channel usage within the geographical area, and Global Positioning System (GPS) information of location(s) within the geographical area, e.g. of objects in the geographical area.

Further, environmental characteristics of a geographical area can include environmental characteristics of possible deployment locations for deploying nodes in the geographical area to form a wireless mesh network. Environmental characteristics of possible deployment locations can include applicable characteristics of the possible deployment locations for deploying a wireless mesh network into a geographical area. For example, environmental characteristics of possible deployment locations can include GPS information of the possible deployment locations, temperature(s) at the possible deployment locations, humidity measurement(s) at the possible deployment locations, line of sight information at the possible deployment locations, background noise information at the possible deployment locations, radio channel usage at the possible deployment locations, and other environmental knowledge of the possible deployment locations. For example, environmental characteristics of a possible deployment location can include whether the possible deployment location is in a building. In another example, environmental characteristics of a possible deployment location can include that a tree has been recognized within a line of sight of the possible deployment location.

Environmental characteristics of a geographical area can be gathered according to an applicable technique for gathering environmental characteristics of a geographical area. For example, environmental characteristics of a geographical area can be already gathered by a customer and subsequently provided in order to identify a wireless mesh network deployment scheme. In another example, environmental characteristics of a geographical area can be gathered by deploying technicians to the geographical area to collect the environmental characteristics of the geographical area.

Further, environmental characteristics of a geographical area can be gathered by sensors in the geographical area. The sensors can be wireless sensors and transmit environmental characteristics data of the geographical area over an applicable wireless connection. For example, the sensors can use the Long Range (LoRa) protocol to transmit gathered environmental characteristics data of the geographical area. In another example, the sensors can use the 4G protocol to transmit gathered environmental characteristics data of the geographical area. The sensors in the geographical area can be owned and operated by a separate entity. Accordingly, the environmental characteristics data of the geographical area gathered by the sensors can be obtained/purchased from the entity that owns and operates the sensors. For example, the sensors can be deployed in the field by a public utility company, and the environmental characteristics data gathered by the sensors can be purchased from the public utility company.

At step 504, network characteristics of an optimum deployment scheme for forming the wireless mesh network are defined. An optimum deployment scheme can be a scheme that properly forms a wireless mesh network, e.g. such as the example network deployment 400 shown in FIG. 4. Further an optimum deployment scheme can be a deployment scheme that properly forms a wireless mesh network using fewer network resources, costs, and hardware, when compared to a non-optimum deployment scheme, such as the deployment scheme 320 shown in FIG. 3C.

An optimum deployment scheme can be defined by network characteristics. Network characteristics of an optimum deployment scheme are values of network parameters to meet/attempt to meet in forming a wireless network, e.g. a wireless mesh network, according to the optimum deployment scheme. Specifically, network characteristics of an optimum deployment scheme can be defined based on a preferred number of nodes for forming a wireless network, e.g. a wireless mesh network, according to the optimum deployment scheme. For example, network characteristics of an optimum deployment scheme can be defined to use the fewest number of nodes as possible, thereby reducing the overall expense of a network deployment. Further, network characteristics of an optimum deployment scheme can be defined based on a preferred topology of network devices for forming a wireless network, e.g. a wireless mesh network, according to the optimum deployment scheme. For example, network characteristics of an optimum deployment scheme can be defined to include a specific number of hops and a specific number of nodes in each hop in a network deployment. Additionally, network characteristics of an optimum deployment scheme can be defined based on preferred wireless signal coverage within a wireless network, e.g. a wireless mesh network, formed according to the optimum deployment scheme. For example, network characteristics of an optimum deployment scheme can be defined to provide the largest wireless signal coverage in an area through a network deployment.

Network characteristics of an optimum deployment scheme can be specific to customers and be defined on a per-customer basis. For example, a first optimum deployment scheme for a first customer can be defined according to different network characteristics than network characteristics of a second optimum deployment scheme for a second customer. Further in the example, the first customer and the second customer can desire different wireless signal coverage levels in a network deployment. Accordingly, optimum deployment schemes for the first and second customers can be defined according to the different wireless signal coverage levels.

At step 506, a deployment scheme for forming the wireless mesh network is identified based on the network characteristics of the optimum deployment scheme and the environmental information of the geographical area. In identifying the deployment scheme based on the optimum deployment scheme and the environmental information of the geographical area, the deployment scheme can be generated to meet or attempt to meet the network characteristics of the optimum deployment scheme based on the limitations or characteristics of the geographical area. For example, environmental characteristics can include that a specific number of potential node locations are available in the geographical area, and the network characteristics of the optimum deployment scheme can include a desired number of node hops. Accordingly, the deployment scheme can be designed to include nodes at all or a portion of the potential node locations in order to meet the desired number of node hopes. In another example, environmental characteristics can include that objects are within a line of sight around potential node locations, and the network characteristics of the optimum deployment scheme can include a desired signal coverage level around the potential node locations. Accordingly, the deployment scheme can include adding nodes around the potential node locations in order to meet the desired signal coverage level. Further, the deployment scheme can include adding node devices with increased signal power at the potential node locations in order to meet the desired signal coverage level.

Deployment network characteristics can be identified for the deployment scheme as part of identifying the deployment scheme based on the network characteristics of the optimum deployment scheme and the environmental information of the geographic area. Deployment network characteristics include network characteristics that are actually used to deploy the wireless mesh network to the geographical area according to the deployment scheme. Specifically, deployment network characteristics can include a type of node to deploy to potential node location in forming the wireless mesh network, potential locations to deploy nodes to in forming the wireless mesh network, and configurations of the nodes in operation to form the wireless mesh network. For example, deployment network characteristics can include operational signal power levels of nodes for forming the wireless mesh network according to the network characteristics of the optimum deployment scheme. Subsequently, the wireless mesh network can be created according to the network characteristics of the deployment scheme, in order to form the wireless mesh network according to the deployment scheme.

Figure 6:
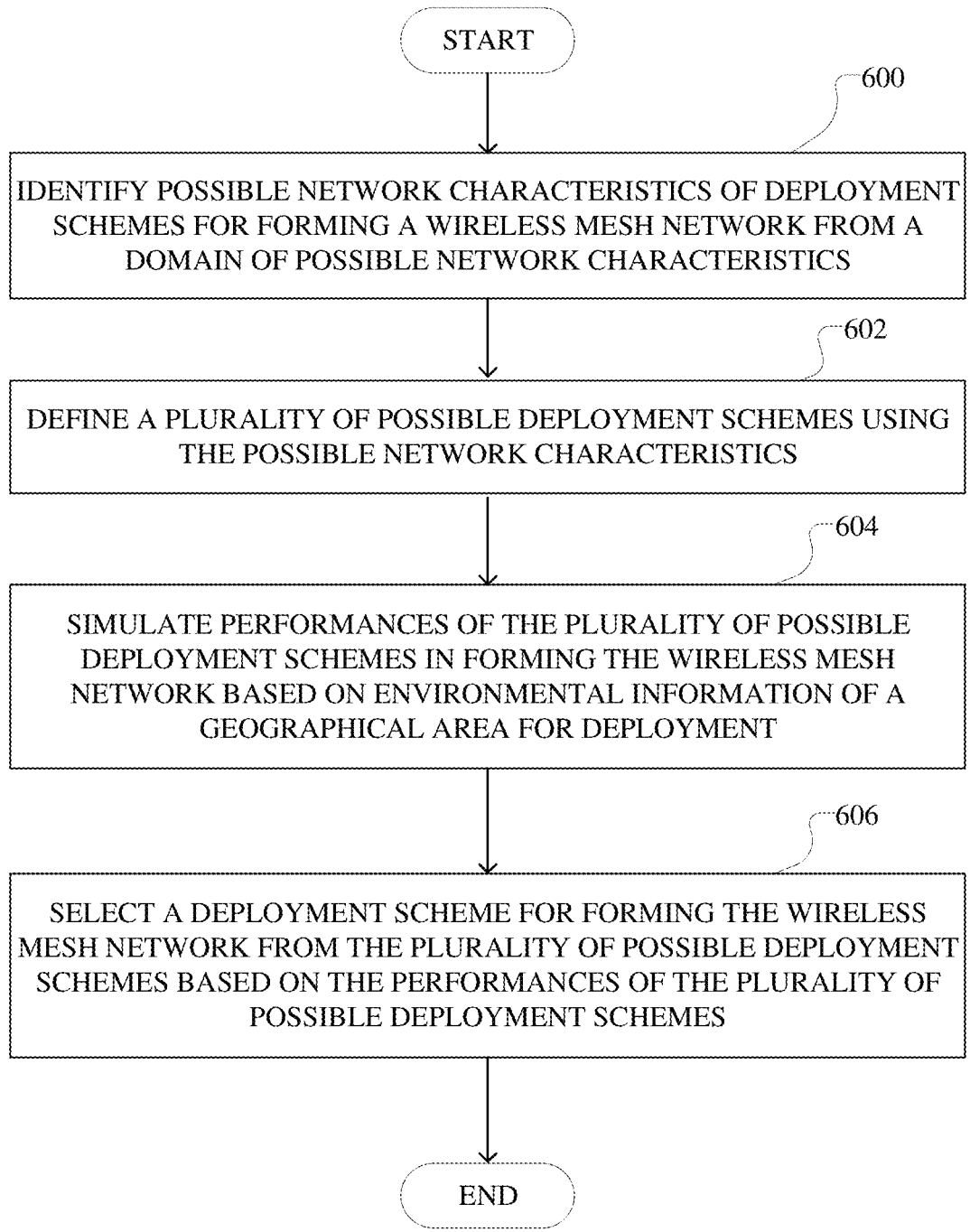
FIG. 6 illustrates a flowchart for an example method of identifying a deployment scheme for forming a wireless mesh network based on environmental information of a geographic area using a Monte Carlo simulation technique.

FIG. 6 illustrates a flowchart for an example method of identifying a deployment scheme for forming a wireless mesh network based on environmental information of a geographic area using a Monte Carlo simulation technique. The method shown in FIG. 6 is provided by way of example, as there are a variety of ways to carry out the method. Additionally, while the example method is illustrated with a particular order of steps, those of ordinary skill in the art will appreciate that FIG. 6 and the modules shown therein can be executed in any order and can include fewer or more modules than illustrated. Each module shown in FIG. 6 represents one or more steps, processes, methods or routines in the method.

All or a portion of the example method shown in FIG. 6 can be performed remote from a geographical area for which a network deployment is identified. Specifically, all or portions of the example method shown in FIG. 6 can be performed in an applicable cloud computing or fog computing environment, such as the example cloud computing architecture 100 shown in FIG. 1A and the example fog computing architecture 150 shown in FIG. 1B.

At step 600, possible network characteristics of deployment schemes for forming a wireless mesh network are identified from a domain of possible network characteristics. The possible network characteristics can include applicable network characteristics, such as the previous network characteristics of the optimum deployment scheme discussed with respect to FIG. 5. Specifically, the possible network characteristics can include possible node locations in a geographical area, a number of nodes, and applicable node operational parameters, such as transmit power and radio channel selection. The possible network characteristics can be selected based on environmental characteristics of a geographical area in which the wireless mesh network will be deployed. For example, in a street lighting scenario, network characteristics can identify the street lighting locations that can all serve as possible node deployment locations. Further, the possible network characteristics can be selected based on network characteristics of an optimal deployment, such as is discussed with respect to the method shown in FIG. 5.

The domain of possible network characteristics can be selected based on a customer. Specifically, a customer can provide the actual domain of possible network characteristics for forming a wireless mess network. More specifically, the customer can provide the actual domain of possible network characteristics as part of network characteristics of an optimal deployment for the customer.

At step 602, a plurality of possible deployment schemes are defined using the possible network characteristics. The plurality of possible deployment schemes can be defined to form different combinations of the possible network characteristics. For example, a first possible deployment scheme can be defined to include a node at a first possible deployment location while a second possible deployment scheme can be defined to exclude a node at the first possible deployment location. In another example, possible deployment scheme can be defined to adjust transmit power levels at nodes in different possible deployment schemes.

The plurality of possible deployment schemes can be customer specific. For example, the possible deployment schemes can be selected based on network characteristics of an optimum deployment of a customer. In another example, the possible deployment schemes can be selected based on environmental characteristics of a geographical location of a customer.

At step 604, performances of the plurality of possible deployment schemes in forming the wireless mesh network are simulated. Specifically, the plurality of possible deployment schemes can be simulated to determine characteristics of corresponding virtualized wireless mesh networks in providing network service access according to the possible deployment schemes. Further, the plurality of possible deployment schemes can be simulated based on environmental characteristics of a geographical location of the deployment schemes. For example, received signal strength indicators (RSSI)s can be simulated for different locations in a geographical area based on the possible deployment schemes.

At step 606, a deployment scheme for forming the wireless mesh network is selected from the plurality of possible deployment schemes. The deployment scheme can be selected based on the performances of the plurality of possible deployment schemes that are simulated. For example, if a deployment scheme is simulated and provides desired wireless signal coverage, then the deployment scheme can be selected for forming the wireless mesh network. In another example, if a deployment scheme is simulated and provides desired hop numbers, then the deployment scheme can be selected for forming the wireless mesh network.

In selecting a deployment scheme for forming the wireless network, a score aggregation technique can be applied. The score aggregation technique can be applied to remove unreasonable candidate deployment schemes for better fitting. The score aggregation technique can include averaging network characteristics defining possible deployment schemes across a plurality of simulations of the deployment schemes. For example, and as will be discussed in greater detail later, network characteristics defining a deployment scheme can be weighted and summed for the deployment scheme based on one or more simulations of the deployment scheme. This process can be repeated across a large number of possible deployments and corresponding simulations of the possible deployments.

Subsequently, variances of the network characteristics defining the possible deployment schemes can be identified. Specifically, the variances of the network characteristics can be identified based on the averaged network characteristics across the plurality of possible deployment schemes. The possible deployment schemes can then each be scored based on the variances of the network characteristics. Subsequently, a possible deployment scheme can be selected according to the scoring of the possible deployments based on the variances of the network characteristics.

The following is a further explanation of this score aggregation technique. For example, it can be assumed that there are four main measurements for evaluating. There are two deployment schemes. The first deployment scheme can have good scores in 3 of the main measurements but have a poor score in the last measurement. The second deployment scheme can have average scores in all four areas. Further, the second deployment scheme can be better than the first deployment scheme for a model, but have a sum of scores less than the first deployment scheme. In order to avoid this problem, the score aggregation technique can include the following.

Network characteristics defining the possible deployment scores can be summed according to Equation 1.

$$\text{Sum} = \sum_{i=0}^{n} k_i Q_i \qquad \text{Equation 1}$$

$Q_1, Q_2, \ldots Q_n$ are the network characteristics defining a possible deployment, $k_1, k_2, \ldots k_n$ is the weight of each factor. For example, $Q_1$ can be the total expense of the deployment to a customer and $k_1=30\%$. $Q_2$ can be rate of nodes with received signal strength indicator (RSSI)s lower than a threshold value and $k_2=30\%$. $Q_3$ can be a hop number which identifies network depth and $k_3=20\%$. $Q_4$ can be an average width of each hop and $k_4=20\%$.

In various embodiments, in order to avoid overfitting problems, e.g. caused by possible deployments having high scores but also containing one or a few very low factors, the possible deployments having scores are selected based on a score threshold. For example, the possible deployments having the highest 1% of scores of the possible deployments can be selected.

Subsequently, the variance for each network characteristic across the possible deployments, e.g. selected possible deployments, is then identified. Specifically, the average value for a network characteristic can be calculated according to Equation 2.

Equation 2

In the example shown in Equation 2, $x_1 \ldots x_n$ is the output of the network characteristics $Q_1$ in n time samples, e.g. corresponding to different simulated possible deployments. M is the average value of $x_1 \ldots x_n$ The variance of network characteristics can be calculated according to Equation 3. Specifically, $s^2$ is the variance of a network characteristic, e.g. $Q_1$.

Equation 3

This variance can be used to adjust the weighted network characteristics. Then the weighted network characteristics can be summed, such as shown in Equation 1. The best deployment, e.g. most closely realizing an optimum deployment based on environmental characteristics can be the possible deployment having the lowest resultant sum score when accounting for variances of the network characteristics. Specifically, the possible deployment with the lowest sum score can have the best deployment performance and each network characteristics defining the deployment are close to an optimal value.

While the techniques described herein have been discussed with respect to identifying a deployment scheme for a new wireless mesh network, the techniques can also be used to identify a modified deployment scheme for an already deployed wireless mesh network. For example, a customer can use the techniques described herein to determine whether to modify a current deployment of a wireless mesh network, e.g. based on environmental characteristics. Subsequently, the customer can modify the current deployment according to a modified deployment scheme identified using the techniques described herein.

The disclosure now turns to FIGS. 7 and 8, which illustrate example network devices and computing devices, such as switches, routers, load balancers, client devices, and so forth.

FIG. 7 illustrates a computing system architecture 700 wherein the components of the system are in electrical communication with each other using a connection 705, such as a bus. Exemplary system 700 includes a processing unit (CPU or processor) 710 and a system connection 705 that couples various system components including the system memory 715, such as read only memory (ROM) 720 and random access memory (RAM) 725, to the processor 710. The system 700 can include a cache 712 of high-speed memory connected directly with, in close proximity to, or integrated as part of the processor 710. The system 700 can copy data from the memory 715 and/or the storage device 730 to the cache 712 for quick access by the processor 710. In this way, the cache 712 can provide a performance boost that avoids processor 710 delays while waiting for data. These and other modules can control or be configured to control the processor 710 to perform various actions. Other system memory 715 may be available for use as well. The memory 715 can include multiple different types of memory with different performance characteristics. The processor 710 can include any general purpose processor and a hardware or software service, such as service 1 732, service 2 734, and service 3 736 stored in storage device 730, configured to control the processor 710 as well as a special-purpose processor where software instructions are incorporated into the actual processor design. The processor 710 may be a completely self-contained computing system, containing multiple cores or processors, a bus, memory controller, cache, etc. A multi-core processor may be symmetric or asymmetric.

To enable user interaction with the computing device 700, an input device 745 can represent any number of input mechanisms, such as a microphone for speech, a touch-sensitive screen for gesture or graphical input, keyboard, mouse, motion input, speech and so forth. An output device 735 can also be one or more of a number of output mechanisms known to those of skill in the art. In some instances, multimodal systems can enable a user to provide multiple types of input to communicate with the computing device 700. The communications interface 740 can generally govern and manage the user input and system output. There is no restriction on operating on any particular hardware arrangement and therefore the basic features here may easily be substituted for improved hardware or firmware arrangements as they are developed.

Storage device 730 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 725, read only memory (ROM) 720, and hybrids thereof.

The storage device 730 can include services 732, 734, 736 for controlling the processor 710. Other hardware or software modules are contemplated. The storage device 730 can be connected to the system connection 705. In one aspect, a hardware module that performs a particular function can include the software component stored in a computer-readable medium in connection with the necessary hardware components, such as the processor 710, connection 705, output device 735, and so forth, to carry out the function.

FIG. 8 illustrates an example network device 800 suitable for performing switching, routing, load balancing, and other networking operations. Network device 800 includes a central processing unit (CPU) 804, interfaces 802, and a bus 810 (e.g., a PCI bus). When acting under the control of appropriate software or firmware, the CPU 804 is responsible for executing packet management, error detection, and/or routing functions. The CPU 804 preferably accomplishes all these functions under the control of software including an operating system and any appropriate applications software. CPU 804 may include one or more processors 808, such as a processor from the INTEL X86 family of microprocessors. In some cases, processor 808 can be specially designed hardware for controlling the operations of network device 800. In some cases, a memory 806 (e.g., non-volatile RAM, ROM, etc.) also forms part of CPU 804. However, there are many different ways in which memory could be coupled to the system.

The interfaces 802 are typically provided as modular interface cards (sometimes referred to as "line cards"). Generally, they control the sending and receiving of data packets over the network and sometimes support other peripherals used with the network device 800. Among the interfaces that may be provided are Ethernet interfaces, frame relay interfaces, cable interfaces, DSL interfaces, token ring interfaces, and the like. In addition, various very high-speed interfaces may be provided such as fast token ring interfaces, wireless interfaces, Ethernet interfaces, Gigabit Ethernet interfaces, ATM interfaces, HSSI interfaces, POS interfaces, FDDI interfaces, WIFI interfaces, 3G/4G/5G cellular interfaces, CAN BUS, LoRA, and the like. Generally, these interfaces may include ports appropriate for communication with the appropriate media. In some cases, they may also include an independent processor and, in some instances, volatile RAM. The independent processors may control such communications intensive tasks as packet switching, media control, signal processing, crypto processing, and management. By providing separate processors for the communications intensive tasks, these interfaces allow the master CPU 804 to efficiently perform routing computations, network diagnostics, security functions, etc.

Although the system shown in FIG. 8 is one specific network device of the present technology, it is by no means the only network device architecture on which the present technology can be implemented. For example, an architecture having a single processor that handles communications as well as routing computations, etc., is often used. Further, other types of interfaces and media could also be used with the network device 800.

Regardless of the network device's configuration, it may employ one or more memories or memory modules (including memory 806) configured to store program instructions for the general-purpose network operations and mechanisms for roaming, route optimization and routing functions described herein. The program instructions may control the operation of an operating system and/or one or more applications, for example. The memory or memories may also be configured to store tables such as mobility binding, registration, and association tables, etc. Memory 806 could also hold various software containers and virtualized execution environments and data.

The network device 800 can also include an application-specific integrated circuit (ASIC), which can be configured to perform routing and/or switching operations. The ASIC can communicate with other components in the network device 800 via the bus 810, to exchange data and signals and coordinate various types of operations by the network device 800, such as routing, switching, and/or data storage operations, for example.

For clarity of explanation, in some instances the present technology may be presented as including individual functional blocks including functional blocks comprising devices, device components, steps or routines in a method embodied in software, or combinations of hardware and software.

In some embodiments the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

Claim language reciting "at least one of" refers to at least one of a set and indicates that one member of the set or multiple members of the set satisfy the claim. For example, claim language reciting "at least one of A and B" means A, B, or A and B.

What is claimed is:

1. A method comprising:
   identifying a geographical area for deployment of a wireless mesh network;
   collecting environmental information of the geographical area;
   defining first network characteristics of an optimum deployment scheme for forming the wireless mesh network, the optimum deployment being specific to each customer for which the wireless mesh network is deployed;
   determining variations in second network characteristics, the second network characteristics being associated with possible deployment schemes for forming the wireless mesh network; and
   identifying a deployment scheme for forming the wireless mesh network based on the first network characteristics of the optimum deployment scheme, the variations in the second network characteristics, and the environmental information of the geographical area.

2. The method of claim 1, wherein the wireless mesh network is a Wireless Smart Utility Networks (Wi-SUN) compliant network.

3. The method of claim 1, wherein the identifying the deployment scheme for forming the wireless mesh network includes identifying third network characteristics of the deployment scheme based on the first network characteristics of the optimum deployment scheme, the variations in the second network characteristics, and the environmental information of the geographical area.

4. The method of claim 1, wherein the environmental information of the geographical area includes geographical locations of possible locations to deploy nodes to in the geographical area.

5. The method of claim 4, wherein the environmental information of the geographical area includes temperatures at the possible locations, humidity at the possible locations, line of sight information for providing wireless network access at the possible locations, background noise information at the possible locations, environmental characteristics of environments surrounding the possible locations, and radio channel usage at the possible locations.

6. The method of claim 1, wherein the environmental information of the geographical area is gathered by one or more sensors deployed in the geographical area, and the environmental information is wirelessly transmitted from the geographical area for identifying the deployment scheme.

7. The method of claim 1, wherein the first network characteristics of the optimum deployment scheme for forming the wireless mesh network are defined based on a preferred number of nodes for forming the wireless mesh network.

8. The method of claim 1, wherein the first network characteristics of the optimum deployment scheme for forming the wireless mesh network are defined based on preferred wireless signal coverage within the wireless mesh network.

9. The method of claim 1, wherein the first network characteristics of the optimum deployment scheme for forming the wireless mesh network are defined based on a preferred topology of network devices for forming the wireless mesh network.

10. The method of claim 1, wherein the deployment scheme for forming the wireless mesh network is identified through a Monte Carlo simulation technique.

11. The method of claim 10, further comprising:
identifying possible network characteristics of deployment schemes for forming the wireless mesh network from a domain of possible network characteristics;
defining the possible deployment schemes for forming the wireless mesh network using the possible network characteristics;
simulating performances of the possible deployment schemes in forming the wireless mesh network based on the environmental information of the geographical area; and
determining the variations in the second network characteristics based on results of simulating the performances of the possible deployment schemes.

12. The method of claim 11, wherein the possible deployment schemes are customer specific.

13. The method of claim 11, wherein determining the variations in the second network characteristics comprises:
averaging the second network characteristics defining the possible deployment schemes across a plurality of simulations of the possible deployment schemes;
identifying variances of the second network characteristics using averages of the second network characteristics across the plurality of simulations of the possible deployment schemes;
scoring the possible deployment schemes based on the variances; and
selecting the deployment scheme, in part, based on the variances of the second network characteristics.

14. A system comprising:
one or more processors; and
at least one computer-readable storage medium having stored therein instructions which, when executed by the one or more processors, cause the one or more processors to:
identify a geographical area for an initial deployment of a Wireless Smart Utility Networks (Wi-SUN) compliant wireless mesh network;
collect environmental information of the geographical area;
define first network characteristics of an optimum deployment scheme for forming the wireless mesh network, the optimum deployment being specific to each customer for which the wireless mesh network is deployed;
determine variations in second network characteristics, the second network characteristics being associated with possible deployment schemes for forming the wireless mesh network; and
identify a deployment scheme for forming the wireless mesh network based on the first network characteristics of the optimum deployment scheme, the variations in the second network characteristics, and the environmental information of the geographical area.

15. The system of claim 14, wherein the one or more processors are configured to identify third network characteristics of the deployment scheme based on the first network characteristics of the optimum deployment scheme, the variations in the second network characteristics, and the environmental information of the geographical area.

16. The system of claim 14, wherein the deployment scheme for forming the wireless mesh network is identified through a Monte Carlo simulation technique.

17. The system of claim 16, wherein the instructions which, when executed by the one or more processors, further cause the one or more processors to:
identify possible network characteristics of deployment schemes for forming the wireless mesh network from a domain of possible network characteristics;
define the possible deployment schemes for forming the wireless mesh network using the possible network characteristics;
simulate performances of the possible deployment schemes in forming the wireless mesh network based on the environmental information of the geographical area; and
determine the variations in the second network characteristics based on results of simulating the performances of the possible deployment schemes.

18. The system of claim 17, wherein the one or more processors are configured to determine the variations in the second network characteristics by:
averaging the second network characteristics defining the possible deployment schemes across a plurality of simulations of the possible deployment schemes;
identifying variances of the second network characteristics using averages of the second network characteristics across the plurality of simulations of the possible deployment schemes;
scoring the possible deployment schemes based on the variances; and
selecting the deployment scheme, in part, based on the variances of the second network characteristics.

19. A non-transitory computer-readable storage medium having stored therein instructions which, when executed by a processor, cause the processor to:
identify a geographical area for an initial deployment of a Wireless Smart Utility Networks (Wi-SUN) compliant wireless mesh network;
collect environmental information of the geographical area;
define first network characteristics of an optimum deployment scheme for forming the wireless mesh network, the optimum deployment being specific to each customer for which the wireless mesh network is deployed;
determine variations in second network characteristics, the second network characteristics being associated with possible deployment schemes for forming the wireless mesh network; and
identify a deployment scheme for forming the wireless mesh network based on the first network characteristics of the optimum deployment scheme, the variations in the second network characteristics, and the environmental information of the geographical area.

* * * * *